May 2, 1967 F. D. SHEPHERD, JR 3,317,801

TUNNELING ENHANCED TRANSISTOR

Filed June 19, 1963 2 Sheets-Sheet 1

INVENTOR.
FREEMAN D. SHEPHERD Jr.
BY Wade Koontz
Martin Finnegan
ATTORNEYS

May 2, 1967 F. D. SHEPHERD, JR 3,317,801

TUNNELING ENHANCED TRANSISTOR

Filed June 19, 1963 2 Sheets-Sheet 2

INVENTOR.
FREEMAN D. SHEPHERD Jr.
BY
ATTORNEYS 3,317,801
Patented May 2, 1967

3,317,801
TUNNELING ENHANCED TRANSISTOR

Freeman D. Shepherd, Jr., Waltham, Mass.
(8 Berkshire Road, West Chelmsford, Mass. 01863)

Filed June 19, 1963, Ser. No. 289,145
1 Claim. (Cl. 317—235)

The invention described herein may be manufactured and used by or for the United States Government for governmental purposes without payment to me of any royalty thereon.

This invention relates to semiconductor devices, and more particularly to the application of diode tunneling principles to a junction transistor in such manner as to achieve greater-than-unity gain.

Current gain in the usual junction transistor is less than unity. Emitter current disperses through the base region and is collected at the collector. Some small portion of that current however takes the shorter path through the base circuit. With the present invention more electrons are made available within the base region due to tunneling. A much larger current in the collector circuit appears than is present in the emitter circuit as a result.

It can be observed from an examination of the standard equation for input impedance of a conventional transistor that the input impedance is necessarily low. The present invention provides methods and means for increasing the input impedance of a transistor substantially, such methods and means involving introduction of negative resistance within the base circuit through diode tunneling. As a consequence, a much larger input impedance is obtainable with this invention than with the usual transistor.

An object of the invention, as above indicated, is to increase the current gain factor, in a junction transistor, by application of the diode tunnel effect (also known as the "Esaki effect") to the junction area between two zones of the transistor, in such manner as to produce positive feedback to the emitter region of the transistor while concurrently increasing the base diffusion current by the addition of tunnel current to the incremental emitter input current.

A second object of the invention is to achieve the desired greater-than-unity gain by utilizing a four-zone construction, with the junction areas between zones so arranged that two of the zones are highly doped with impurities appropriate for production of diode tunneling of the "Esaki" order, while the two remaining zones function as conventional junction transistor p-n components.

A third object of the invention is to provide a four-zone junction transistor with parallel junction regions coacting to reduce the net resistance factor in the base circuit and thereby increase input impedance and bring about an "alpha" characteristic (short circuit current gain factor) that is greater than unity.

Another object of this invention is to provide a junction transistor device wherein 0° or 180° phase shift in output can be selected by a change in collector bias.

Another object of this invention is to provide a readily reproducible and reliable device having characteristics as outlined above.

Figure 1:
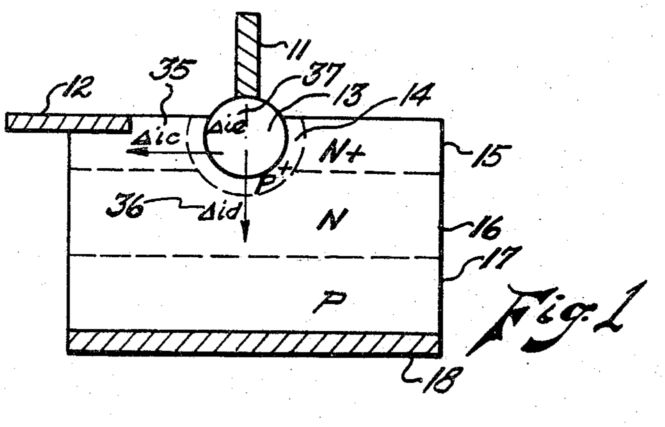

These and other objects of the present invention will be more clearly apparent after a study of the following specification when read in connection with the accompanying drawings, in which:

FIG. 1, a modified PNP type junction transistor, is shown structurally.

Figure 2:
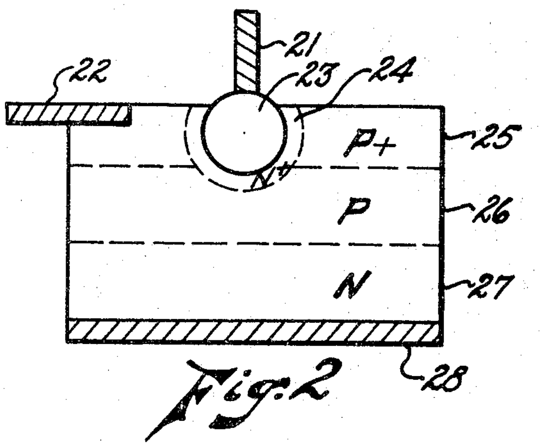

FIG. 2, a modified NPN type junction transistor, is shown structurally.

Figure 3:
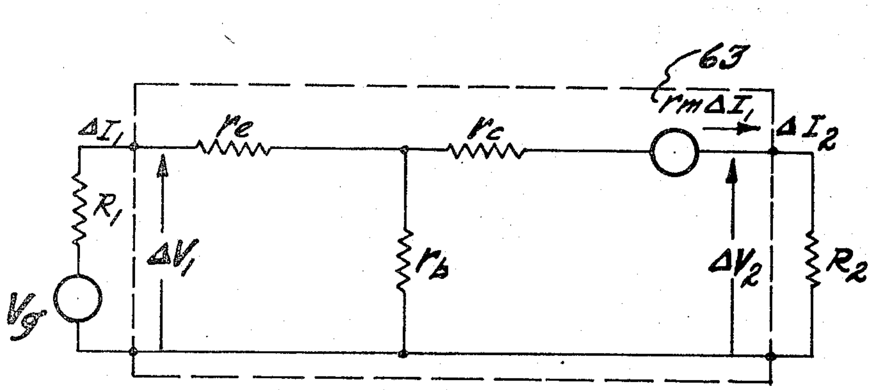

FIG. 3 shows an equivalent circuit of this transistor.

Figures 4, 5:
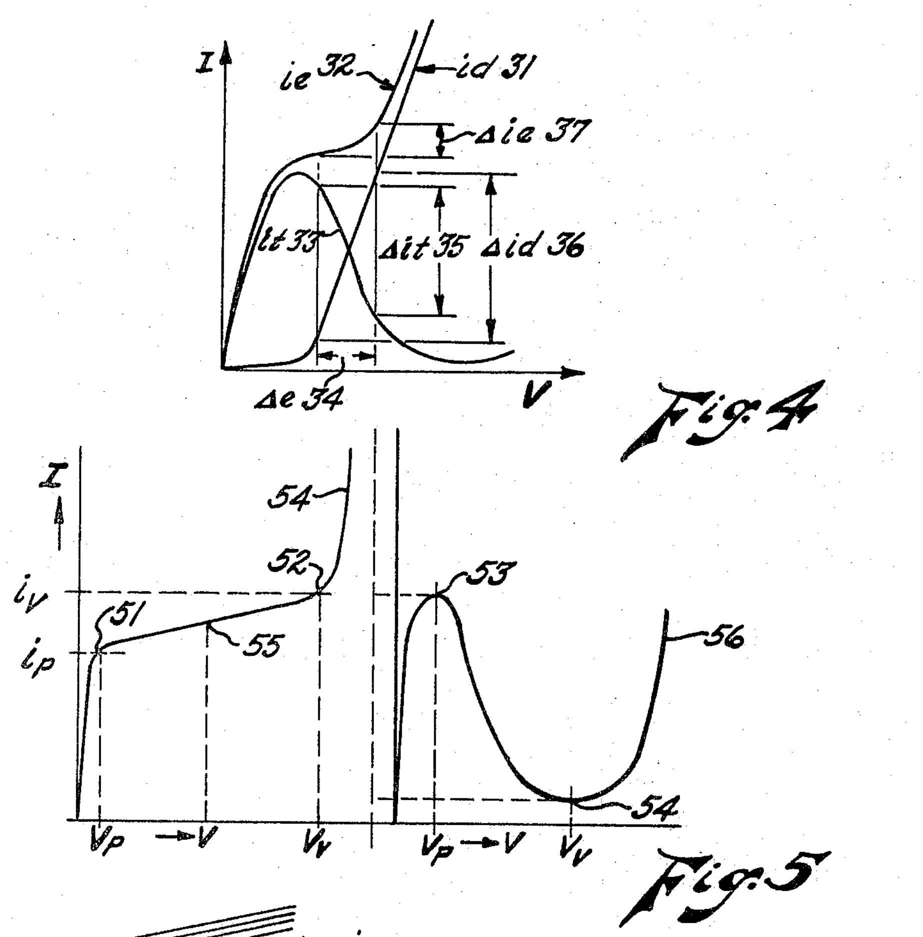

FIG. 4, current continuity curve within the emitter structure.

FIG. *5a*, emitter-base characteristics when the current is carried largely by diffusion.

FIG. *5b*, emitter-base characteristics when the current is carried largely by tunneling.

Figure 6:
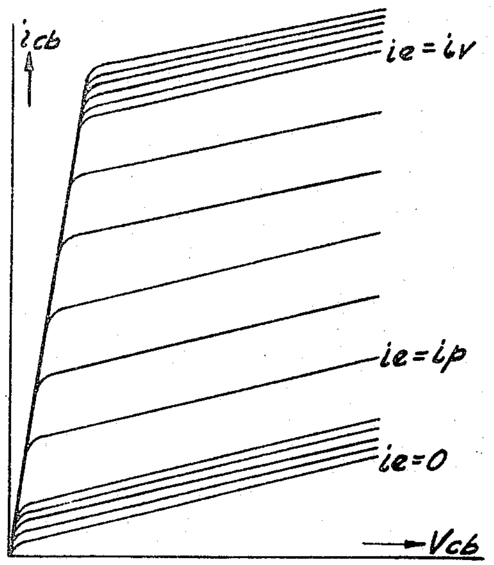

FIG. 6, collector-base characteristics.

Referring to FIG. 1, a germanium or silicon device is shown. Collector contact 18 is attached to P type germanium or silicon material 17. P type semiconductor 17 is in turn attached to N type germanium or silicon material 16. Between layers 16 and 17 is a diffused P-N junction. On layer 16 is placed an N+ germanium or silicon epitaxial or diffused layer 15 depending whether a silicon or germanium device is desired. Base contact 12 is attached to this layer. Dot 13 of indium containing 1% gallium is affixed to germanium material, and alternatively a dot of aluminum containing 1% gallium is affixed to silicon, again depending whether a germanium or silicon device is desired. Region 14 is regrown so that it becomes P+. Emitter contact 11 is attached to dot 13.

Both P+ and N+ regions are over-doped as an Esaki or tunnel diode. N and P layers are doped with impurities to the level normally encountered in junction transistors.

In FIG. 2, a germanium-gallium arsenide hetero-junction device structure is shown. Here layer 27 is N type germanium, layer 26 is P type germanium, layer 25 is a P+ epitaxial gallium-arsenide layer. The remainder of the structure will correspond with the previously shown device of FIG. 1. Throughout the remainder of this specification reference will be confined to structure shown in FIG. 1; however, in principle, references will be applicable to both structures.

Effectively we have a device, illustrated by the structure shown in FIG. 1, having two parallel emitter P-N junctions, one with current carried by diffusion of minority carriers and a second with current carried by quantum mechanical tunneling of electrons.

The mechanism by which the transistor current gain is increased takes place in the emitter-diode structure. Since technology with reference to the collector is well documented, the following discussion will relate only to the base-emitter structure.

Referring to FIG. 4 current continuity within the emitter structure is shown. Curve 32 represents current that passes largely by tunneling. Curve 31 represents current that passes largely by diffusion.

Examining FIG. 1 once again, it can be seen that any change in emitter current $\Delta ie$ 37 will result in two components $\Delta ic$ 35 and $\Delta id$ 36. Preserving current continuity in this structure:

$$\therefore \Delta ic = \Delta it + \Delta id$$

The gain mechanism can now be explained with reference to FIG. 4. With a small increase in voltage, $\Delta e$ 34, applied to the emitter-base terminal pair, an increase in input current $\Delta ie$ 37 results. Considering current continuity as we did above $\Delta ie$ must equal the algebraic sum of the tunnel current, $\Delta it$ 35, leaving the P+ type region 14 FIG. 1 through the N+ type region 15 FIG. 1 and the diffusion current, $\Delta id$ 36, leaving the P+ type by the N type region eventually arriving at collector 18 FIG. 1.

Assuming the increase in voltage is within the range of voltages in which the tunnel current is decreasing, the change in tunnel current $\Delta i_t$ 35 will be negative. With $\Delta i_t$ 35 negative then from the above equation:

$$\Delta i_e = \Delta i_t + \Delta i_d$$

we see that:

$$\Delta i_d > \Delta i_e$$

therefore:

$$\frac{\Delta i_d}{\Delta i_e} > 1$$

This is also shown graphically in FIG. 4.

Considering the emitter efficiency to be the ratio of minority current injected into the base region to the total input current, it is apparent that emitter efficiency greater than 100% is obtained. Furthermore, if the current gain $\Delta i_d / \Delta i_e$ of the emitter structure is sufficient to overcome recombination losses in the base region of the transistor, the overall current gain will also be greater than unity.

In actual practice current gains of the order of 10 have been experienced. With recombination losses being between 1 and 10%, overall current gains of from 9 to 10 are realized.

Referring to FIG. 5*a*, the emitter-base characteristics are shown when most of the emitter current is carried by diffusion. FIG. 5*b* shows the emitter-base characteristics when emitter current is largely carried by tunneling.

At point 51 in FIG. 5*a* peak tunneling is indicated and corresponding voltage $V_p$ and current $i_p$ are indicated. At point 52 in the same figure minimum tunneling is indicated and corresponding voltage $V_v$ and current $i_v$ are indicated. In FIG. 5 corresponding points are indicated at 53 and 54. The differences in value for $V_p$, $i_p$ and $V_v$, $i_v$ in the two curves are related to the different relative magnitude of $i_t$ and $i_d$. As indicated in the preceding paragraph in FIG. 5*a* $|\Delta i_d| > |\Delta i_t|$ and in FIG. 5*b* $|\Delta i_t| > |\Delta i_d|$.

Small signal limits correspond to $V_p$ and $V_v$. The value for these will vary with material used. With structure shown in FIG. 1 using germanium, the maximum signal ($V_v - V_p$) will be approximately 250 millivolts and when silicon is used the maximum signal will be approximately 350 millivolts. With structure shown in FIG. 2 utilizing gallium arsenide a maximum signal will be approximately equal to 550 millivolts.

However, it will be noted that the gain factor is reduced when large signals are applied. The emitter gain factor is $$\frac{\Delta i_d}{\Delta i_d - \Delta i_t}$$

As the factor increases $I_v$ converges with $i_p$ and the incremental current signal limits, $i_p - i_v$ approaches zero. In brief, signal handling capacity is sacrificed for high current gain. In R.F. amplifiers low signal levels exist and high current gain is possible. In I.F. amplifiers where higher level signals exist, lower current gain will necessarily result.

In the presentation by Becker and Shive, ("Electrical Engineering," vol. 68, pp. 215–223, March 1949) the authors illustrate in equivalent circuit diagram form the circuit parameters involved in the application of a conventional transistor to the task of controlling the transfer of relatively small signal currents at low frequencies. The "FIG. 3" illustration herein is substantially a reproduction of the Becker and Shive equivalent circuit diagram, except $r_m$ 63 FIG. 3 is often equated to $\alpha r_c - \alpha$ being approximately equal to the base transport factor. In the present invention, $\alpha$ is the product of the emitter structure current gain and base transport factor. These two factors cannot be separated easily in measuring the device. Some estimation would therefore be necessary.

The distinct non-linearity of the device may be exploited in several ways. For instance, referring to FIG. 5*a*, with a transistor biased at $V_p$51, a detector with gain can be constructed. Consider for the moment, a sine wave applied to the input. The positive half cycle ($V > V_p$) will be amplified in the output current. The negative half cycle ($V < V_p$) will inject minority carriers into the base and will not appear at the collector. By shunting the collector-base terminal pair with a resistor and capacitor as is done in a simple diode detector, amplitude demodulation will be obtained.

Using the above input characteristics biasing the device at $$\frac{V_p + V_v}{2}$$

at point 55 FIG. 5*a*, the drop in gain at points 51 and 52 will act as a limiting mechanism. This feature may be exploited in an FM limiter.

With the configuration shown in FIG. 2*b* and an input source impedance greater than the negative impedance within the range of $V_p$53 and $V_v$54 an input pulse would switch the device through the region of high gain as shown in FIG. 6.

With a similar configuration, the input could be designed to oscillate at a given local oscillatory frequency. An additional signal applied to the input could change the oscillatory loop impedance in that the input current voltage characteristic is non-linear. The local and applied frequencies would then be mixed for conversion purposes.

In analog circuits it is occasionally desirable to be able to select a 0° phase shift or a 180° phase shift in the output by changing collector bias. With the present invention such a feature is readily obtainable. When collector current is largely by diffusion a 0° phase shift in output with respect to input appears. When collector current is largely by tunneling a 180° phase shift in output with respect to input will be experienced. Under given circuit conditions, an increase in collector voltage can switch the device by causing the diffusion current to increase to such a point that it is greater than the tunneling current.

Point contact devices have certain of the above characteristics. However, the principles of operation in the point contact transistor and the modified junction transistor differ. Furthermore, junction transistors are more reliable and are reproducible with greater ease and consistency.

Whereas this invention has been shown and described with reference to specific embodiments, it is to be understood that changes may be made and equivalents substituted without departing from the spirit and scope of the invention.

What is claimed is:

A germanium transistor having an alpha greater than one comprising four zones only with said zones having differing impurities, two of said zones having quantities of impurities corresponding to quantities of impurities contained within the various zones within a conventonal transistor, and the remaining two zones having quantities of impurities corresponding to quantities of impurities within the various zones within a conventional tunnel diode, said first two zones being designated N and P types, said second two zones being designated N+ type and P+ type, said zones being interrelated with one another such that the N+ type is in intimate contact with both the P+ type and the P type, the P type being in intimate contact with the N type, the N+ type having a terminal connection designated an emitter terminal, the P+ type having a terminal connection designated a base terminal, the N type having a terminal connection designated a collector terminal, and the P+ region being an epitaxial layer regrown from a dot of indium containing one percent gallium, and the N+ region being regrown from a gallium-arsenide heterojunction.

References Cited by the Examiner

UNITED STATES PATENTS

| | | | |
|---|---|---|---|
| 3,079,512 | 2/1963 | Rutz | 317—235 |
| 3,100,166 | 8/1963 | Marinace et al. | 317—235 |
| 3,114,864 | 12/1963 | Chih-Tangsah | 317—235 |

| | | | |
|---|---|---|---|
| 3,121,808 | 2/1964 | Dawon Kahng | 313—235 |
| 3,171,042 | 2/1965 | Matare | 317—234 |
| 3,171,762 | 3/1965 | Rutz | 317—235 |
| 3,176,147 | 3/1965 | Miller | 317—235 |
| 3,236,698 | 2/1966 | Shockley | 317—235 |

FOREIGN PATENTS

| | | |
|---|---|---|
| 1,303,035 | 7/1962 | France. |

JOHN W. HUCKERT, *Primary Examiner.*

A. J. JAMES, *Assistant Examiner.*